US012701885B2

(12) United States Patent (10) Patent No.: US 12,701,885 B2
Shin et al. (45) Date of Patent: Aug. 4, 2026

(54) DISPLAY DEVICE FOR IMPROVING DISPLAYING QUALITY AND DISPLAY PANEL THEREOF

(71) Applicant: LG DISPLAY CO., LTD., Seoul (KR)

(72) Inventors: Mihee Shin, Gyeonggi-do (KR);
SeungHyun Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 966 days.

(21) Appl. No.: 17/889,622

(22) Filed: Aug. 17, 2022

(65) Prior Publication Data

US 2023/0135563 A1 May 4, 2023

(30) Foreign Application Priority Data

Oct. 28, 2021 (KR) ........................ 10-2021-0145135

(51) Int. Cl.
*H10K 59/35* (2023.01)
*H10K 59/65* (2023.01)
(52) U.S. Cl.
CPC ......... *H10K 59/353* (2023.02); *H10K 59/352* (2023.02); *H10K 59/65* (2023.02)
(58) Field of Classification Search
CPC ...... H10K 59/353; H10K 59/35; H10K 59/65; H10K 59/352; H10K 59/60; G09G 3/20; G09G 2300/0452
See application file for complete search history.

(56) References Cited

U.S. PATENT DOCUMENTS

| 12,245,465 | B2 * | 3/2025 | Chung | ................. H10K 59/122 |
| 2019/0326366 | A1 | 10/2019 | Fan | |
| 2020/0105843 | A1 | 4/2020 | Baek et al. | |
| 2021/0202595 | A1 | 7/2021 | Lee et al. | |
| 2021/0241680 | A1 | 8/2021 | Ock et al. | |

(Continued)

FOREIGN PATENT DOCUMENTS

| CN | 110619813 A | 12/2019 |
| CN | 111430436 A | 7/2020 |

(Continued)

OTHER PUBLICATIONS

Office Action issued in Korean Patent Application No. 10-2021-0145135 dated Dec. 18, 2024.

(Continued)

*Primary Examiner* — Joseph L Williams
(74) *Attorney, Agent, or Firm* — Morgan, Lewis & Bockius LLP

(57) ABSTRACT

A display apparatus may include a display panel including a first area corresponding to a first resolution, a second area corresponding to a second resolution lower than the first resolution, and a third area corresponding to a third resolution lower than the second resolution, and a sensor disposed under the panel to overlap at least a portion of the third area. Pixels are disposed in the first area based on a first arrangement corresponding to a first pixel group including sub-pixels. Pixels are disposed in the second area based on a second arrangement corresponding to a second pixel group in which at least one of the sub-pixels of the first pixel group is omitted. Pixels are disposed in at least a part of the third area based on the first arrangement. A light transmittance portion is disposed in another part of the third area.

20 Claims, 8 Drawing Sheets

(56)                        References Cited

U.S. PATENT DOCUMENTS

| | | |
|---|---|---|
| 2021/0358379 A1 | 11/2021 | Li et al. |
| 2022/0190051 A1 | 6/2022 | Lou et al. |

FOREIGN PATENT DOCUMENTS

| | | | |
|---|---|---|---|
| CN | 113284460 A | 8/2021 | |
| EP | 3813044 A1 | 4/2021 | |
| EP | 3859725 A1 | 8/2021 | |
| KR | 10-2020-0036137 A | 4/2020 | |
| KR | 10-2020-0078687 A | 7/2020 | |
| KR | 10-2021-0082845 A | 7/2021 | |
| KR | 10-2021-0098091 A | 8/2021 | |
| KR | 10-2021-0145135 A | 12/2021 | |
| WO | WO-2020067611 A1 * | 4/2020 | .......... H10K 59/122 |

OTHER PUBLICATIONS

Notice of allowance issued in Korean Patent Application No. 10-2021-0145135 dated Aug. 31, 2025 (Note: KR1020200078687A and KR1020210098091A cited therein are already of record.).

Office Action issued in Vietnamese Patent Application No. 1-2022-06017 dated Sep. 1, 2025 with English translation.

Extended European Search Report issued in European Patent Application No. 22190350.3, dated Feb. 7, 2023.

Office Action issued on Mar. 25, 2026 for Chinese Patent Application No. 202211012767.7 (Note: WO2020067611A1 cited therein is already of record.).

* cited by examiner

*FIG.4A*
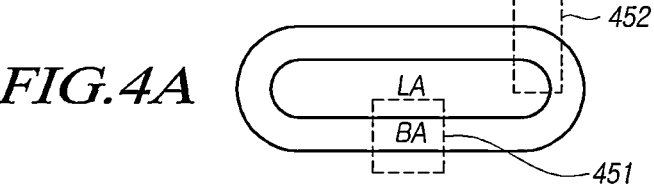
*FIG.4B*
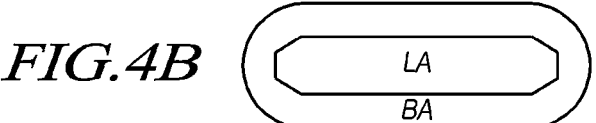
*FIG.4C*
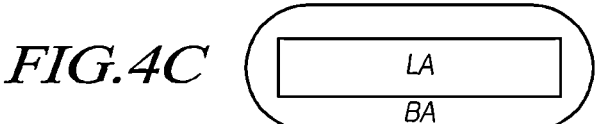
*FIG.4D*

DISPLAY DEVICE FOR IMPROVING DISPLAYING QUALITY AND DISPLAY PANEL THEREOF

CROSS REFERENCE TO RELATED APPLICATION

This application claims the benefit of and priority to Korean Patent Application No. 10-2021-0145135, filed on Oct. 28, 2021, the entirety of which is incorporated herein by reference for all purposes as if fully set forth herein.

TECHNICAL FIELD

The present disclosure relates to electronic devices, including, without limitation, a display device (or display apparatus) and a display panel therefor for improving a display quality.

BACKGROUND

In electronic devices such as smartphones and tablets, there are disposed various sensors together with a display device. Examples of various sensors include, for example, camera sensors.

In general, a camera sensor is disposed below a through hole penetrating a bezel of the electronic device. However, as the bezel size has recently decreased to expand a display area, there has been actively-conducted research on a structure in which a camera sensor is disposed behind a display area of a display device and light transmission of the display area is utilized.

In the display area, the area overlapping the camera sensor requires a low resolution of pixels per inch (PPI) to sufficiently secure light transmittance. Accordingly, the display area may include areas having different resolutions, for example, a high-resolution area and a low-resolution area.

In the case that the display area has a high-resolution area and a low-resolution area, the boundary between the high-resolution area and the low-resolution area may be recognized, and the low-resolution area may be visible due to a decrease in luminance of the low-resolution area so that the display quality may be deteriorated. Accordingly, there is a need for a method for improving display quality by reducing visibility of the boundary between areas having different resolutions.

The description provided in the background section should not be assumed to be prior art merely because it is mentioned in or associated with the background section. The background section may include information that describes one or more aspects of the subject technology.

SUMMARY

In one or more implementations, an object of embodiments of the present disclosure is to provide a display device (or display apparatus) and a display panel capable of improving a deterioration of display quality caused by recognizing a boundary between two areas having different resolutions.

However, the objects of the present disclosure are not limited to those mentioned above and may include other technical objects described in the present disclosure.

In an aspect of the present disclosure, there is provided a display device including a panel including a first area corresponding to a first resolution, a second area corresponding to a second resolution lower than the first resolution, and a third area corresponding to a third resolution lower than the second resolution, and a sensor disposed under the panel to overlap at least a portion of the third area, wherein a plurality of pixels may be disposed in the first area based on a first arrangement corresponding to a first pixel group including a plurality of sub-pixels, a plurality of pixels may be disposed in the second area based on a second arrangement corresponding to a second pixel group in which at least one of the plurality of sub-pixels of the first pixel group is omitted, a plurality of pixels may be disposed in at least a part of the third area based on the first arrangement, and a light transmittance portion may be disposed in another part of the third area.

In another aspect of the present disclosure, there is provided a display panel including a first area corresponding to a first resolution, a second area corresponding to a second resolution lower than the first resolution, and a third area corresponding to a third resolution lower than the second resolution, wherein a plurality of pixels may be disposed in the first area based on a first arrangement corresponding to a first pixel group including a plurality of sub-pixels, a plurality of pixels may be disposed in the second area based on a second arrangement corresponding to a second pixel group in which at least one of the plurality of sub-pixels of the first pixel group is omitted, a plurality of pixels may be disposed in at least a part of the third area based on the first arrangement, and a light transmittance portion may be disposed in another part of the third area.

The specific details of other embodiments are included in the detailed description and drawings.

One or more example embodiments of a display device and a display panel of the present disclosure can improve a display quality by arranging a pixel in which at least one sub-pixel is omitted between two areas having different resolutions to reduce the visibility of the boundary.

It should be noted that the effects obtainable in the present disclosure are not limited to the above-mentioned effects, and other effects not mentioned may be understood clearly to those of ordinary skill in the art to which this disclosure belongs from the description provided herein.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings:

FIGS. 4A, 4B, 4C, and 4D illustrate examples in which areas having different resolutions are disposed among the display areas of the display device according to embodiments of the present disclosure.

DETAILED DESCRIPTION

Figure 1:
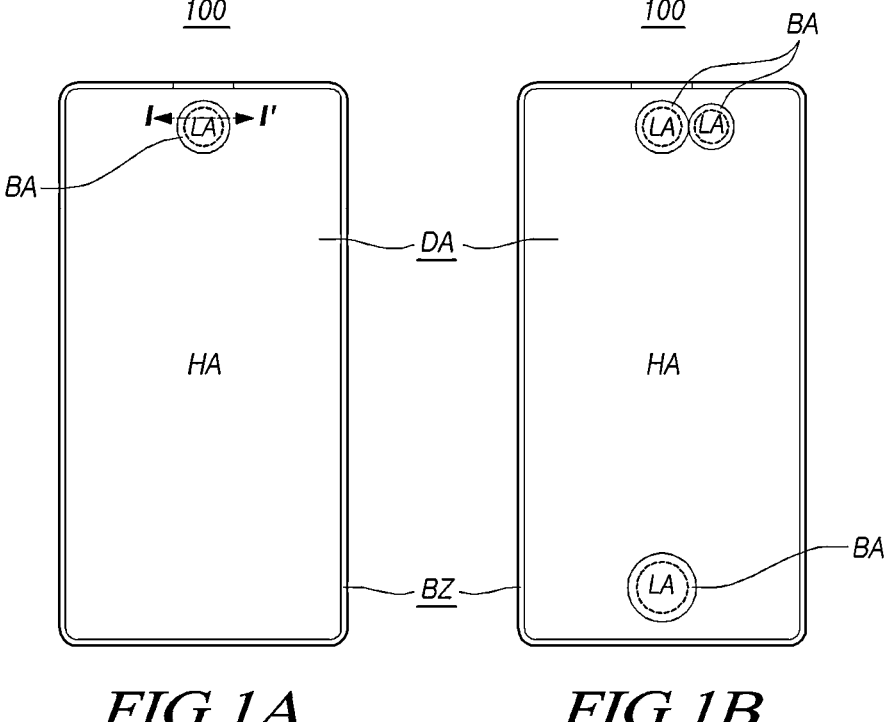
FIGS. 1A and 1B illustrate examples of a display area of a display device according to an embodiment of the present disclosure.

Reference will now be made in detail to embodiments of the present disclosure, examples of which may be illustrated in the accompanying drawings.

In the following description, the structures, embodiments, implementations, methods and operations described herein are not limited to the specific example or examples set forth herein and may be changed as is known in the art, unless otherwise specified. Like reference numerals designate like elements throughout, unless otherwise specified. Names of the respective elements used in the following explanations are selected only for convenience of writing the specification and may thus be different from those used in actual products.

Advantages and features of the present disclosure, and a method for achieving them will become apparent with reference to the embodiments described below in detail in conjunction with the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents. In the following description, where the detailed description of the relevant known function or configuration may unnecessarily obscure aspects of the present disclosure, a detailed description of such known function or configuration may be omitted.

In one or more aspects, the terms used in the embodiments are selected as currently widely used general terms as possible while considering the functions in the present disclosure, which may vary depending on the intention of a person skilled in the art, the precedent, the emergence of new technology, or other considerations. In addition, in a specific case, there is a term arbitrarily selected by the inventors, and in this case, the meaning thereof will be described in detail in the corresponding description. Therefore, the terms used in the present disclosure should be defined based on the meaning of the term and the overall content of the present disclosure, rather than the simple name of the term.

In the present disclosure, when a part "includes" an element, it means that other elements may be further included, rather than excluding other elements, unless otherwise stated.

The expression of "at least one of" A, B, and C may include a configuration of A alone, B alone, C alone, A and B, A and C, B and C, or all of A, B, and C.

The shapes, sizes, areas, ratios, angles, numbers, and the like disclosed in the drawings for explaining the embodiments in the present disclosure are exemplary, and the embodiments of the present disclosure are not limited to the illustrated matters.

Where the terms "comprise," "have," "include," "contain," "constitute," "make up of," "formed of," and the like are used, one or more other elements may be added unless the term, such as "only" is used. When an element is expressed in the singular, there may be understood to include cases including the plural unless otherwise explicitly stated. In addition, in construing an element, the element is to be construed as including an error or tolerance range even where no explicit description of such an error or tolerance range is provided.

Where positional relationships are described, for example, where the positional relationship between two parts is described using "on," "over," "under," "above," "below," "beneath," "near," "close," or "adjacent," "beside," "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top," "bottom, "downward," "upward," "upper," "lower," and the like refer to an arbitrary frame of reference.

In describing a temporal relationship, when the temporal order is described as, for example, "after," "subsequent," "next," or "before," a case which is not continuous may be included unless a more limiting term, such as "just," "immediate(ly)," or "direct(ly)" is used.

For the expression that an element or layer is "connected," "coupled," or "adhered" to another element or layer, the element or layer can not only be directly connected, coupled, or adhered to another element or layer, but also be indirectly connected, coupled, or adhered to another element or layer with one or more intervening elements or layers "disposed" or "interposed" between the elements or layers, unless otherwise specified.

For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers "disposed" or "interposed" between the elements or layers, unless otherwise specified.

When the terms, such as "first," "second," or the like, are used herein to describe various elements or components, it should be considered that these elements or components are not limited thereto. These terms are merely used herein for distinguishing an element from other elements. Therefore, a first element mentioned below may be a second element in a technical concept of the present disclosure.

The area, length, or thickness of each component described in the present disclosure is illustrated for convenience of description, and the present invention is not necessarily limited to the area, length, and thickness of the illustrated component.

The features of each of the embodiments of the present disclosure may be partially or wholly combined or coupled with each other and may be technically linked or operated together. In addition, each of the embodiments may be implemented independently of each other or may be implemented together in a related relationship.

In addition, the terms to be described later are terms defined in consideration of functions in the implementation of the present disclosure, which may vary depending on the intention or custom of a user or operator. Therefore, the terms should be interpreted based on the content throughout this present disclosure.

In one or more example embodiments, a transistor constituting a pixel circuit of the present disclosure may include at least one of an oxide thin film transistor (Oxide TFT), an amorphous silicon TFT (a-Si TFT), and a low temperature poly silicon TFT (LTPS TFT).

The following example embodiments will be mainly described with respect to an organic light emitting diode display device. However, embodiments of the present disclosure are not limited to an organic light emitting display device and may be applied to an inorganic light emitting display device including an inorganic light emitting material. For example, embodiments of the present disclosure may be applied to a quantum dot display device.

Expressions such as "first," "second," and "third" are terms used to classify configurations according to example embodiments, and embodiments are not limited to these terms. Therefore, it should be noted that even the same terms may refer to different components according to example embodiments.

Various example embodiments of the present disclosure are described below with reference to the drawings. In addition, for convenience of description, a scale in which each of elements is illustrated in the accompanying drawings may differ from an actual scale. Thus, the illustrated elements are not limited to the specific scale in which they are illustrated in the drawings.

Figure 2:
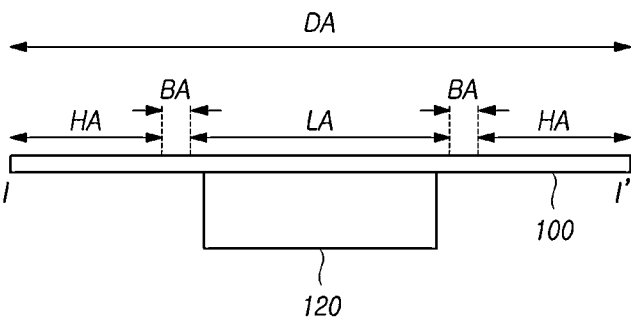
FIG. 2 is a cross-sectional view illustrating an example overlapping structure of a display area and a sensor along line I-I' in a display area shown in FIG. 1A.

FIGS. 1A and 1B illustrate examples of a display area of a display device according to an embodiment of the present disclosure, and FIG. 2 is a cross-sectional view illustrating an example overlapping structure of a display area and a sensor along line I-I' in a display area shown in FIG. 1A.

A display device according to an example embodiment of the present disclosure may be an electroluminescent display device. The electroluminescent display device may include an organic light emitting diode (OLED) display device, a quantum-dot light emitting diode (QLED) display device, or an inorganic light emitting diode display device.

Referring to FIGS. 1A and 1B and FIG. 2, a display device according to an example embodiment may include a panel 100 having a display area DA in which a plurality of pixels are disposed to display an image, and a bezel area BZ of an outer portion surrounding the display area DA. The display area DA may be expressed as a pixel array area or an active area. In some embodiments, the bezel area BZ may be small or may be omitted.

The panel 100 may further include a touch sensor screen for sensing a user's touch by overlapping the display area DA as a whole, and the touch sensor screen may be embedded in the panel 100 or may be disposed on the display area DA of the panel 100.

The display area DA of the panel 100 may include a high resolution area HA, a boundary area BA, and a low resolution area LA. The high resolution area HA is an area occupying the largest proportion of the display area DA and may have a predetermined first resolution. The high resolution area HA has a pixel arrangement structure having a high pixel density in which unit pixels are disposed so as to have a high PPI (pixels per inch).

The boundary area BA may have a second resolution lower than the first resolution. In the unit pixel of the boundary area BA, one of a plurality of sub-pixels constituting the unit pixel of the high resolution area HA may be omitted. For example, if the unit pixel of the high resolution area HA includes one red sub-pixel, two green sub-pixels, and one blue sub-pixel, the unit pixel of the boundary area BA may include one red sub-pixel, one green sub-pixel, and one blue sub-pixel. The boundary area BA may be disposed between the high resolution area HA and the low resolution area LA.

The low resolution area LA may include an area overlapping a sensor 120 disposed behind the panel 100. The low resolution area LA may include an area (a light emitting area) in which pixels are disposed and a light transmittance portion for transmitting light. The low resolution area LA may have a pixel arrangement structure having a lower pixel density due to a lower PPI than the high resolution area HA and the boundary area BA. That is, the low resolution area LA may have a third resolution lower than the second resolution. A unit pixel disposed in the light emitting area of the low resolution area LA may correspond to a unit pixel of the high resolution area HA. For example, in the case that the unit pixel of the high resolution area HA includes one red sub-pixel, two green sub-pixels, and one blue sub-pixel, the unit pixel of the low resolution area LA may also include one red sub-pixel, two green sub-pixels and one blue sub-pixel.

The sensor 120 overlapping the low resolution area LA may sufficiently secure the transmittance of an incident light or an outgoing light for the sensor 120 passing through the low resolution area LA by a light transmitting part, that is, the light transmittance portion. In order to secure the light transmittance of the sensor 120, the area occupied by the light transmittance portion may be larger than the area occupied by the pixel area in the low resolution area LA. In addition, in order to secure the light transmittance of the sensor 120, as shown in FIG. 2, the size of the low resolution area LA may be larger than the size of the area in which the low resolution area LA and the sensor 120 overlap.

In an embodiment, the sensor 120 using light passing through the low resolution area LA of the display area DA may be a camera sensor, but is not limited thereto, and may include at least one of various optical sensors such as an infrared sensor, an illuminance sensor, a red-green-blue (RGB) sensor, or a fingerprint sensor.

For example, as shown in FIG. 1A, the display area DA of the panel (or display panel) 100 included in the display device may include one low resolution area LA surrounded by the high resolution area HA and the boundary area BA, and the sensor 120 using the transmitted light of the low resolution area LA may be a camera sensor. For another example, as shown in FIG. 1B, the display area DA of the panel 100 may include a plurality of low resolution areas LA each surrounded by a high resolution area HA and a boundary area BA. Each sensor overlapping each of the plurality of low resolution areas LA may correspond to at least one of a camera sensor, an illuminance sensor, and a fingerprint sensor. Specifically, for example, the sensor overlapping the low resolution area LA of a first position may be a camera sensor, and the sensor overlapping the low resolution area LA of a second position may be an infrared sensor.

According to an embodiment, the number of the low resolution areas LA disposed in the display area DA may be variously changed, and the shape thereof may also be variously changed. More specific examples related to the shapes of the low resolution area LA will be described later with reference to FIGS. 4A through 4D.

Figure 3:
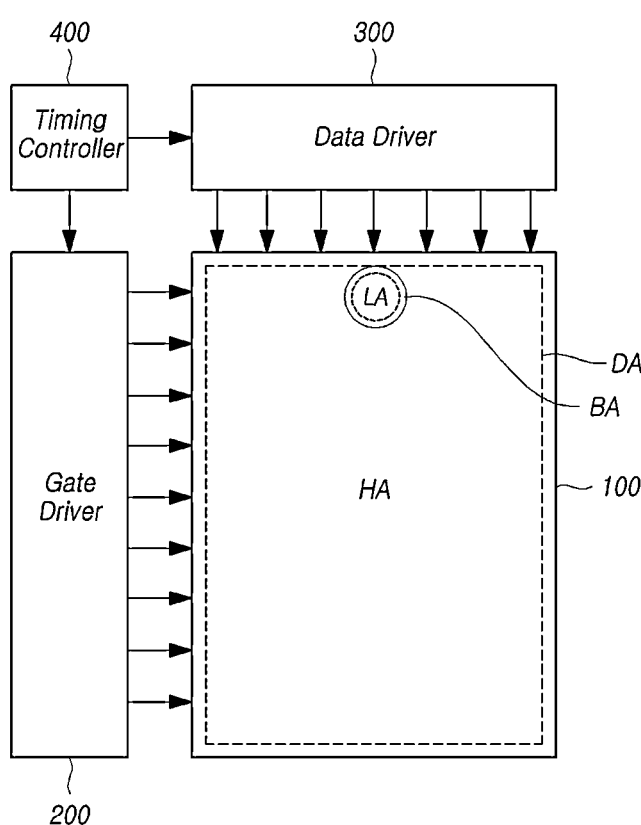
FIG. 3 is a block diagram illustrating a circuit configuration of a display device according to an example embodiment of the present disclosure.

FIG. 3 is a block diagram illustrating a circuit configuration of a display device according to an example embodiment of the present disclosure.

Referring to FIG. 3, a display device may include a display panel 100, a gate driver 200, a data driver 300, and a timing controller 400. In some embodiments, the gate driver 200 and the data driver 300 may be referred to as a panel driver driving the display panel 100. Alternatively, the gate driver 200, the data driver 300 and the timing controller 400 may be referred to as a driver or a driving unit for driving the display device (or the display panel 100).

The display area DA of the panel 100 may include a plurality of unit pixels. Each of the plurality of unit pixels of the display area DA may display an image using red (R) sub-pixels, green (G) sub-pixels, and blue (B) sub-pixels. Each unit pixel may be composed of at least one sub-pixel.

For example, the unit pixel of the high resolution area HA and the unit pixel of the low resolution area LA may include four sub-pixels, such as R, G, B, and G sub-pixels. Among the four sub-pixels constituting the unit pixel of the high-resolution area HA, the red (R) sub-pixel and the blue (B) sub-pixel except for the green (G) sub-pixel may be alternately arranged in a horizontal direction or an x-axis direction. The green (G) sub-pixel may be disposed in a direction perpendicular to the red (R) sub-pixel and the blue (B) sub-pixel. Two green (G) sub-pixels may be included in a unit pixel and may be arranged in a horizontal direction or an x-axis direction.

As another example, the unit pixel of the boundary area BA may include three sub-pixels, such as R, G, and B sub-pixels. Among the three sub-pixels constituting the unit pixel of the boundary area BA, the red (R) sub-pixel and the blue (B) sub-pixel except for the green (G) sub-pixel may be alternately arranged in the horizontal direction or the x-axis direction. The green (G) sub-pixel may be disposed in a direction perpendicular to the red (R) sub-pixel and the blue (B) sub-pixel.

A more detailed description related to the arrangement of sub-pixels will be described later with reference to FIGS. 5 and 6.

The area of the high resolution area HA may be the largest in the display area DA. The boundary area BA may be surrounded by the high resolution area HA. The low resolution area LA may be surrounded by the boundary area BA.

In an embodiment, each sub-pixel constituting a unit pixel may include a luminous element and a pixel circuit independently driving the luminous element. The luminous element may include an organic light emitting diode (OLED), a quantum dot light emitting diode (QLED), or an inorganic light emitting diode (ILED). The pixel circuit may include a plurality of thin film transistors (TFTs) including at least a driving TFT for driving the luminous element, a switching TFT for supplying a data signal to the driving TFT, and a storage capacitor for storing a driving voltage corresponding to a data signal supplied through the switching TFT and supplying the driving voltage to the driving TFT.

According to an embodiment, the pixel circuit may further include a plurality of TFTs for initializing each of the three electrodes (gate, source, and drain) of the driving TFT, connecting the driving TFT with a diode structure for threshold voltage compensation, or controlling the emission time of the luminous element. The configuration of the pixel circuit may be variously implemented, such as 3T1C (3 TFTs and 1 capacitor), 7T1C (7 TFTs and 1 capacitor), and the like.

For example, each pixel may include a pixel circuit including at least a luminous element connected between a power line supplying a high potential driving voltage (a first driving voltage; EVDD) and a common electrode supplying a low potential driving voltage (a second driving voltage; EVSS), and a first and second switching TFTs and the driving TFT and the storage capacitor for independently driving the luminous element.

The luminous element may include an anode connected to the source node of the driving TFT, a cathode connected to the EVSS line, and an organic light emitting layer between the anode and the cathode. The anode is independent for each sub-pixel, but the cathode may be a common electrode shared by all sub-pixels. In the luminous element, when a driving current is supplied from the driving TFT, electrons from the cathode are injected into the organic light emitting layer, and holes from the anode are injected into the organic light emitting layer. The light having a brightness proportional to the current value of the driving current is generated by emitting a fluorescent or phosphorescent material due to a recombination of electrons and holes in the organic light emitting layer.

The first switching TFT may be driven by a scan pulse supplied from the gate driver 200 to one gate line and may apply a data voltage supplied from the data driver 300 to the data line to the gate node of the driving TFT.

The second switching TFT may be driven by a sense pulse supplied from the gate driver 200 to another gate line and may provide a reference voltage supplied from the data driver 300 to the reference line to the source node of the driving TFT. Meanwhile, in a sensing mode, the second switching TFT may provide a reference line with a current reflecting the characteristics of the driving TFT or the characteristics of the luminous element.

The storage capacitor connected between the gate node and the source node of the driving TFT may charge the difference voltage between the data voltage and the reference voltage respectively supplied to the gate node and the source node through the first and second switching TFTs as a driving voltage of the driving TFT, and may hold the charged driving voltage during the light emission period in which the first and second switching TFTs are turned off.

The driving TFT may control the current supplied from the EVDD line according to the driving voltage supplied from the storage capacitor, and may supply the driving current determined by the driving voltage to the luminous element to emit light.

In an embodiment, the gate driver 200 may be controlled according to a plurality of gate control signals supplied from the timing controller 400, and may individually drive the gate lines of the display panel 100. The gate driver 200 may supply a scan signal of the gate-on voltage to the corresponding gate line during the driving period of each gate line, and may supply the gate-off voltage to the corresponding gate line during the non-driving period of each gate line.

In an embodiment, the data driver 300 may be controlled according to a data control signal supplied from the timing controller 400, may convert digital data supplied from the timing controller 400 into an analog data signal, and may supply a corresponding data signal to each of the data lines of the panel 100. In this case, the data driver 300 may convert digital data into analog data signals by using the grayscale voltages in which the plurality of reference gamma voltages supplied from a gamma voltage generator are subdivided. The data driver 300 may supply a reference voltage to a reference line.

Meanwhile, in the sensing mode, the data driver 300 may supply a data voltage for sensing to the data line under the control of the timing controller 400 to drive each pixel. The data driver 300 may sense a pixel current representing the electrical characteristics of the driven pixel as a voltage through a reference line, and may convert it into digital sensing data to provide to the timing controller 400.

The timing controller 400 may control the gate driver 200 and the data driver 300 using timing control signals supplied from an external system and timing setting information stored therein. The timing control signals may include one or more of a dot clock, a data enable signal, a vertical synchronization signal, a horizontal synchronization signal, and the like. The timing controller 400 may generate a plurality of gate control signals for controlling driving timing of the gate driver 200 and supply the gate control signals to the gate driver 400. The timing controller 400 may generate a plurality of data control signals for controlling the driving timing of the data driver 300 and supply the data control signals to the data driver 300.

In an embodiment, the timing controller 400 may perform various image processing on the supplied input image data and output the image-processed data to the data driver 300. The timing controller 400 may further perform image quality improvement processing on the image data, such as compensation for an initial characteristic deviation of each pixel and compensation for deterioration (afterimage).

In an embodiment, the timing controller 400 may control the gate driver 200 and the data driver 300 to drive the panel 100 in the sensing mode, and may perform a sensing function of sensing a threshold voltage of the driving TFT, a mobility of the driving TFT, and a threshold voltage of the luminous element reflecting the characteristic deviation and deterioration of each pixel of the panel 100 through the data driver 300. The timing controller 400 may perform image quality improvement processing for compensating for characteristic deviation and deterioration of each pixel by using the sensing result. The timing controller 400 may accumulate data used in each sub-pixel as stress data, and may further perform image quality improvement processing for compensating for deterioration of each sub-pixel according to the accumulated stress data.

FIGS. 4A, 4B, 4C, and 4D illustrate examples in which areas having different resolutions are disposed among the display areas of the display device according to embodiments of the present disclosure. FIGS. 4A, 4B, 4C, and 4D illustrate examples of various shapes of the boundary area BA and the low resolution area LA on the display area DA of a display device (or a display panel included in the display device). Although not shown, the high resolution area HA may be disposed around the boundary area BA.

FIG. 4A illustrates an example in which the low resolution area LA is arranged in an elliptical shape, and the boundary area BA is arranged in an elliptical shape to surround the low resolution area LA. The boundary area BA is an area located between the low resolution area LA and the high resolution area HA (not shown). In one or more aspects, in order to improve display quality, it is necessary to relieve the visibility of the boundary area BA recognized by the user.

The display device according to example embodiments of the present disclosure may improve display quality by making a configuration of the unit pixels of the boundary area BA and the low resolution area LA to be distinguished from that of the high resolution area HA. A description related thereto will be described later in connection with FIGS. 5 and 6, with reference to a first plane 451 of FIG. 4A, including a portion of each of the low resolution area LA, the boundary area BA, and the high resolution area HA.

In the case that the low resolution area LA is arranged in an elliptical shape as shown in FIG. 4A, an arrangement of the low resolution area LA, the boundary area BA and the high-resolution area HA may be distinguished from the arrangement on the first plane 451. A specific example related thereto will be described later with reference to FIG. 7.

FIG. 4B illustrates an example in which the low resolution area LA is arranged in a hexagonal shape, and the boundary area BA is arranged in an elliptical shape to surround the low resolution area LA.

FIG. 4C illustrates an example in which the low resolution area LA is arranged in a rectangle or a quadrangle, and the boundary area BA is arranged in an elliptical shape to surround the low resolution area LA.

FIG. 4D illustrates an example in which the low resolution area LA is arranged in a circular shape, and the boundary area BA is arranged in a circular shape to surround the low resolution area LA.

In an embodiment, the low resolution area LA may be implemented in various forms, and the boundary area BA may be implemented in various forms to be adjacent to the low resolution area LA and surround the periphery of the low resolution area LA.

Hereinafter, for convenience of description, the unit pixels of the high resolution area HA and the low resolution area LA may be referred to as a first pixel group, and the unit pixels of the boundary area BA may be referred to as a second pixel group. In addition, the high resolution area HA may be referred to as a first area, the boundary area BA may be referred to as a second area, and the low resolution area LA may be referred to as a third area, but embodiments of the present disclosure are not limited thereto.

Figure 5:
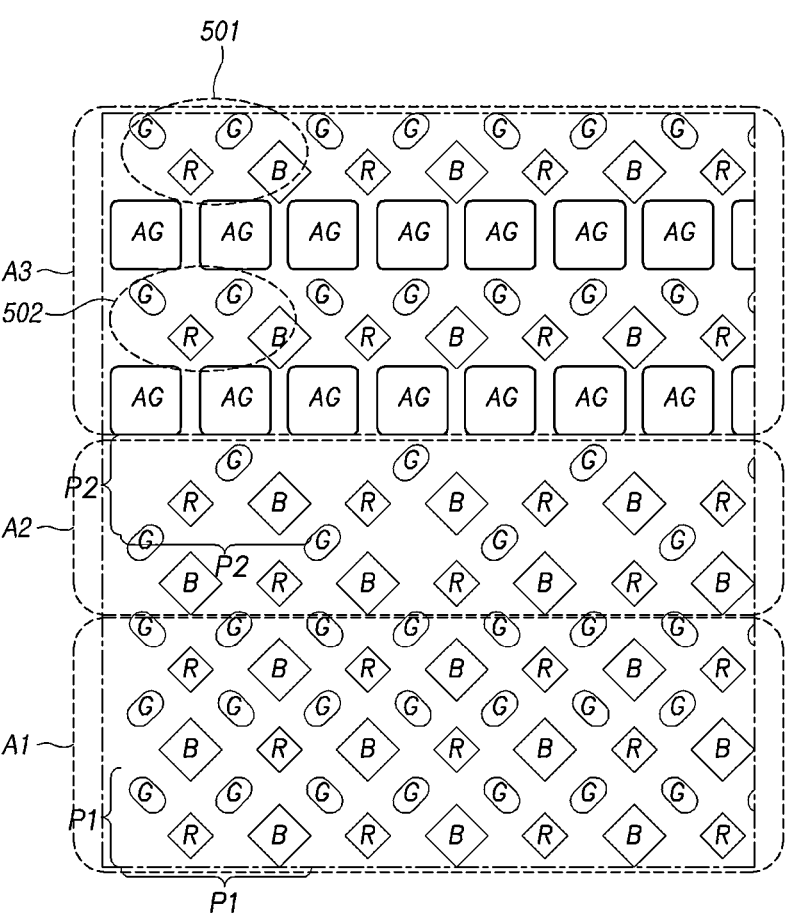
FIG. 5 illustrates a pixel arrangement of a display device according to an example embodiment of the present disclosure.

FIG. 5 illustrates a pixel arrangement of a display device according to an example embodiment of the present disclosure. Specifically, FIG. 5 is an example diagram for explaining a first area (or a high resolution area), a second area (or a boundary area) and a third area (or low resolution area) of the display device (or a display panel included in the display device) based on the plane 451 of FIG. 4A.

Referring to FIG. 5, the plane 451 may include at least a portion of the first area A1, at least a portion of the second area A2, and at least a portion of the third area A3. The second area A2 may be located adjacent to the first area A1, and a third area A3 may be located adjacent to the second area A2. The second area A2 may be positioned between the first area A2 and the third area A3.

In an example embodiment, the first area A1 may correspond to a high resolution area HA having a PPI equal to or greater than a first value, the second area A2 may correspond to the boundary area BA having a PPI less than the first value and equal to or greater than a second value, and the third area A3 may correspond to the low resolution area LA having a PPI less than the second value. Here, the first value may be a value greater than the second value.

In an example embodiment, the first area A1 and the third area A3 may have a pixel arrangement structure of a first pixel group P1 (or the first unit pixel). In the first area A1 and the third area A3, a plurality of sub-pixels may be disposed in each of the plurality of pixels based on a pixel arrangement (which may be, hereinafter, referred to as a first arrangement) of the first pixel group P1. In an example embodiment, the second area A2 may have a pixel arrangement structure of a second pixel group P2. Hereinafter, for convenience of description, one of the pixels disposed in the first area A1 may be used for the description of the first pixel group P1, and one of the pixels disposed in the second area A2 may be used for the description of the second pixel group P2.

In an example embodiment, the plurality of sub-pixels of the first pixel group P1 may include one red (R) sub-pixel, two green (G) sub-pixels, and one blue (B) sub-pixel. In an example embodiment, the shape of each of the red (R) sub-pixel and the blue (B) sub-pixel may correspond to a quadrangle or a rectangle, and the shape of the green (G) sub-pixel may correspond to an ellipse or a circle. In an example embodiment, in this case, the size of the red (R) sub-pixel may be smaller than the size of the blue (B)

sub-pixel. The shape and size of the sub-pixels described herein are examples only, and embodiments are not limited to these examples, and each of the red (R) sub-pixel, green (G) sub-pixel, and blue (B) sub-pixel may have various shapes (e.g., triangle, rhombus, or pentagon) and may be implemented in various sizes.

In an example embodiment, the red (R) sub-pixels and the blue (B) sub-pixels may be arranged in a first row along an x-axis direction, and the two green (G) sub-pixels may be arranged in a second row separated from the first row along the x-axis direction. That is, as illustrated, the red (R) sub-pixels and the blue (B) sub-pixels are arranged horizontally side by side as illustrated, thereby forming the first row. The two green (G) sub-pixels may be arranged horizontally side by side to form another row, i.e., the second row, at the top (or bottom) of the first row containing the red (R) sub-pixels and the blue (B) sub-pixels. Each of the plurality of sub-pixels of the first pixel group P1 may be arranged in a zigzag shape (or alternately) as illustrated in the first and second rows.

In an example embodiment, the two green (G) sub-pixels may have an elliptical shape, and in this case, the two green (G) sub-pixels may be arranged to be symmetrical with respect to the y-axis direction.

In an example embodiment, one of the two green (G) sub-pixels may be disposed in a first diagonal direction, and the other may be disposed in a second diagonal direction. For example, one of the two green (G) sub-pixels may be disposed in a first diagonal direction with an inclination of 45° with respect to the x-axis direction, and the other may be disposed in a second diagonal direction with an inclination of −45° with respect to the x-axis direction.

The plurality of sub-pixels of the second pixel group P2 may include one red (R) sub-pixel, one green (G) sub-pixel, and one blue (B) sub-pixel. The sub-pixel of the second pixel group P2 may be one in which one green (G) sub-pixel among the plurality of sub-pixels of the first pixel group P1 is omitted.

In an example embodiment, if the two green (G) sub-pixels of the first pixel group P1 are respectively arranged in the first diagonal direction and the second diagonal direction, the second pixel group P2 may omit (or exclude) a green (G) sub-pixel arranged in the second diagonal direction. In some cases, the green (G) sub-pixel in the first diagonal direction may be omitted. A specific example related thereto may be provided with reference to FIG. 6.

In an example embodiment, each of the first area A1 may include a plurality of pixels corresponding to a first arrangement of the first pixel group P1. Each of the second area A2 may include a plurality of pixels corresponding to a second arrangement of the second pixel group P2. The third area A3 may include a plurality of pixels corresponding to the first arrangement of the first pixel group P1 and the light transmittance portion AG for transmitting light.

In an example embodiment, a distance between the first area A1 and the third area A3 may correspond to a length of a unit pixel. The length of the unit pixel may correspond to the length of the first pixel group P1 or the second pixel group P2. As shown in FIG. 5, if the horizontal and vertical lengths of the first pixel group P1 or the second pixel group P2 are not constant, the distance between the first area A1 and the third area A3 may be determined as one of a diagonal length or a vertical length of the first pixel group P1 or the second pixel group P2.

In an example embodiment, at least one light transmittance portion may be disposed between at least two pixels among the plurality of pixels of the third area A3. For example, in the case that the third area A3 includes a first pixel 501 and a second pixel 502, at least one of the light transmittance portion AG may be disposed between the first pixel 501 and the second pixel 502 as illustrated.

Although not shown, a sensor may be disposed under the third area A3. The sensor may include at least one of an optical sensor, a camera sensor, an infrared sensor, and an ultraviolet sensor. The sensor may sense various information based on light transmitted through the light transmittance portion AG.

In an example embodiment, the light transmittance portion AG (or the plane of the light transmittance portion AG) may be implemented in various shapes. For example, the plane of the light transmittance portion may be implemented to correspond to a circle or a polygon.

In the display device according to an example embodiment of the present disclosure, the second area A2 having an intermediate resolution is disposed between a first area A1 having a high resolution and a third area A3 having a low resolution, so that it is possible to reduce the visibility of the boundary between the first area A1 and the third area A3 recognized by the user (or as seen from a front side of the display panel), thereby improving the display quality of the display device.

Figure 6:
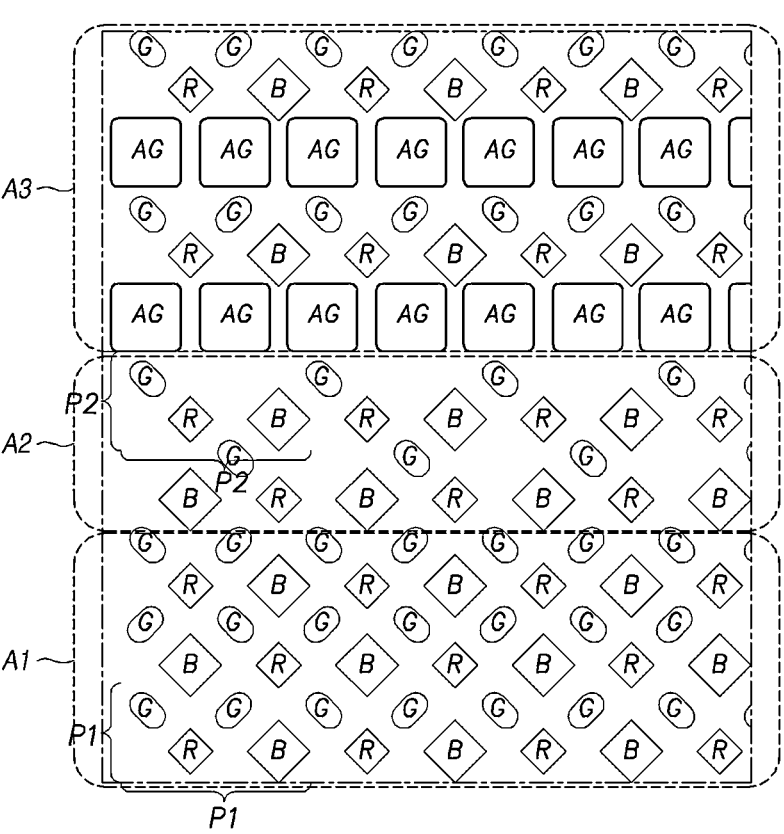
FIG. 6 illustrates a pixel arrangement of a display device according to another example embodiment of the present disclosure.

FIG. 6 illustrates a pixel arrangement of a display device according to another example embodiment of the present disclosure. Specifically, FIG. 6 illustrates an example in which green (G) sub-pixels of the second pixel group are arranged differently from the case of FIG. 5. Hereinafter, a description overlapping with that of FIG. 5 is omitted for brevity.

Referring to FIG. 6, one of the two green (G) sub-pixels of the first pixel group P1 may be disposed in a first diagonal direction, and the other may be disposed in a second diagonal direction. For example, one of the two green (G) sub-pixels may be disposed in a first diagonal direction with an inclination of 45° with respect to the x-axis direction, and the other may be disposed in a second diagonal direction with an inclination of −45° with respect to the x-axis direction.

In this example, the second pixel group P2 may be a pixel group in which one green (G) sub-pixel among the plurality of sub-pixels of the first pixel group P1 is omitted or excluded. For example, in the case that two green (G) sub-pixels of the first pixel group P1 are respectively arranged in the first and second diagonal directions, the green (G) sub-pixel in the first diagonal direction may be excluded in the second pixel group P2.

Figure 7:
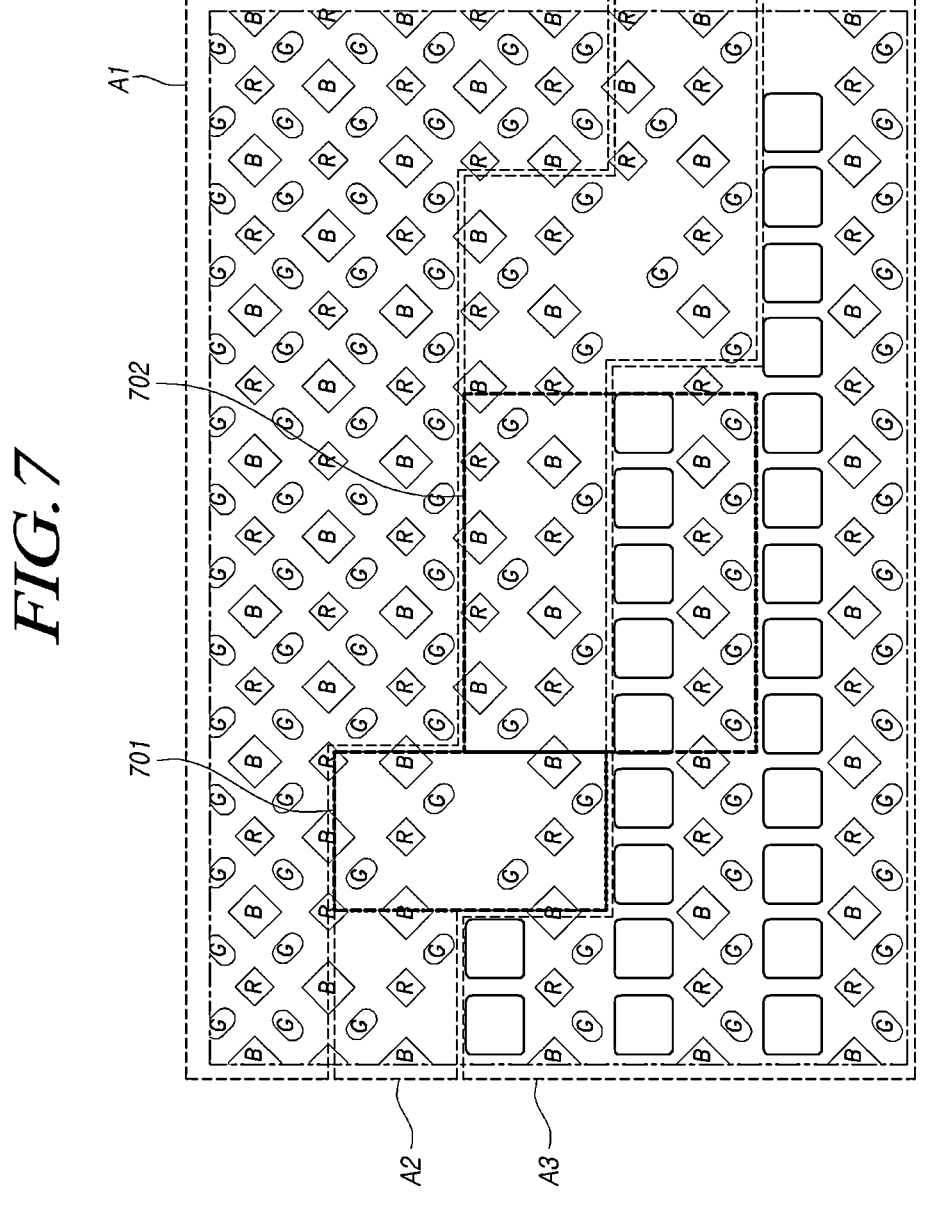
FIG. 7 is a diagram for explaining the arrangement of areas having different resolutions of a display device according to an example embodiment of the present disclosure.

FIG. 7 is a diagram for explaining the arrangement of areas having different resolutions of a display device according to an example embodiment of the present disclosure. Specifically, FIG. 7 is a diagram for explaining a second plane 452 of FIG. 4A.

Referring to FIG. 7, if the third area A3 is a curved area, the second area A2 may be adjacent to the third area A3 and may be disposed to surround the third area A3.

In an example embodiment, the third area A3 may be arranged in a step shape to form a curve. In this case, the second area A2 may also be arranged in a step shape to surround the third area A3. A first area A1 may be disposed outside the second area A2.

In the case that the third area A3 is arranged in a step shape to form a curve, as shown, as the pixel arrangement in the third area A3 ends and the pixel arrangement in the second area A2 starts, a step-shaped area 701 (which may be, hereinafter, referred to as a step area) may be formed. In the step area 701, the second area A2 may be disposed thicker than the area 702 (which may be, hereinafter, referred to as a planar area) in which the pixels of the third area A3 are continuously disposed.

Specifically, referring to FIG. 7, in the step area 701, the second area A2 may be disposed twice as long as a unit pixel length. In this case, a length between the first area A1 and the third area A3 may correspond to twice the unit pixel length. On the other hand, in the planar area 702, the second area A2 may be disposed to correspond to the unit pixel length. In this case, a length between the first area A1 and the third area A3 may correspond to the unit pixel length. Since the unit pixel length has been described with reference to FIG. 5, a detailed description thereof is omitted for brevity.

Figure 8:
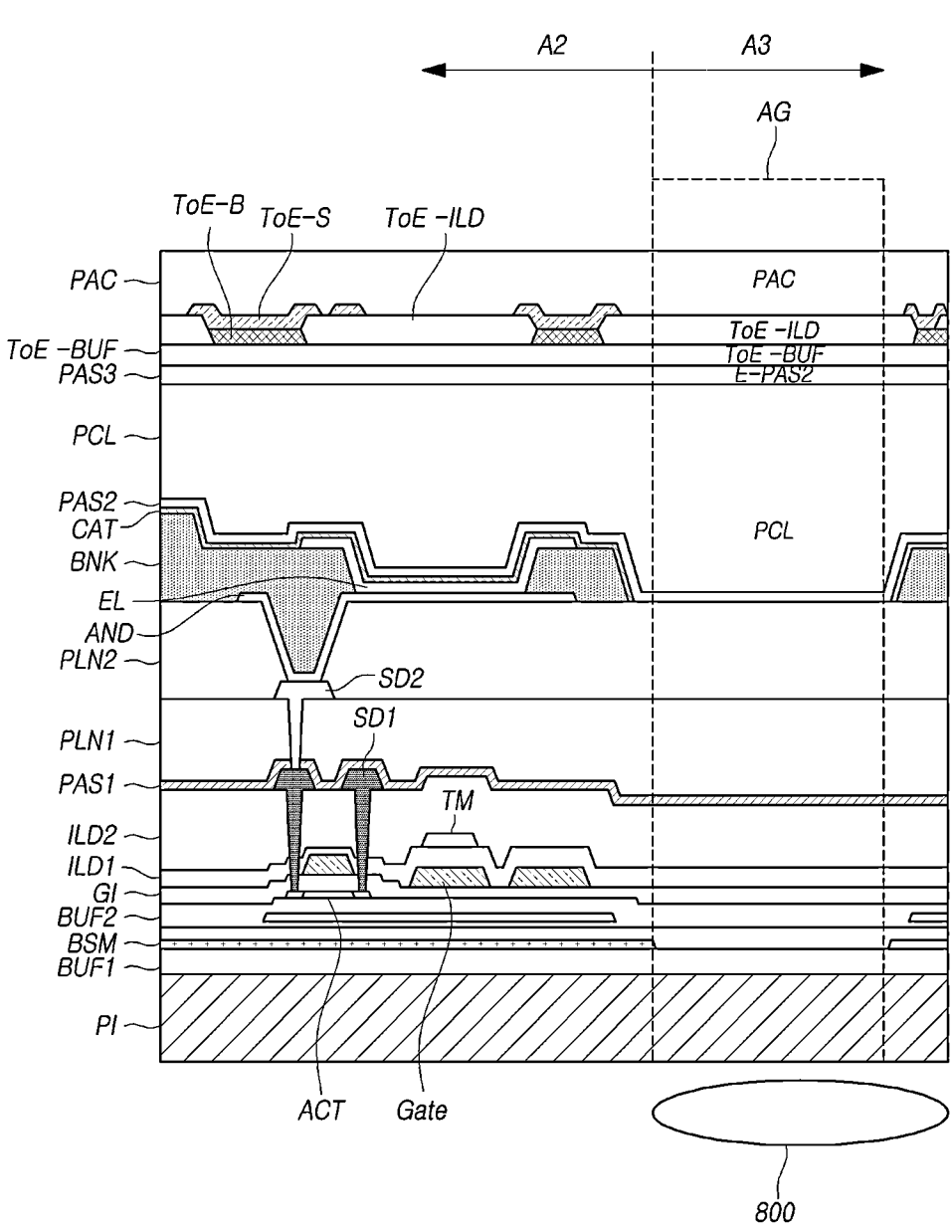
FIG. 8 is a cross-sectional view of the areas having different resolutions in a display device according to an example embodiment of the present disclosure.

FIG. 8 is a cross-sectional view of the areas having different resolutions in a display device according to an example embodiment of the present disclosure. FIG. 8 conceptually illustrates a cross-section of a region where a second area A2 and a third area A3 are adjacent to each other.

A TFT in FIG. 8 may represent a driving transistor DT of a pixel circuit. Referring to FIG. 8, a circuit layer, a luminous element layer, and the like may be stacked on a substrate PI in a pixel area PIX. The substrate PI may include a first PI substrate (not shown) and a second PI substrate (not shown). An inorganic layer (not shown) may be positioned between the first PI substrate and the second PI substrate. The inorganic layer can block water penetration.

A first buffer layer BUF1 may be formed on the substrate PI (e.g., on the second PI substrate PI2). A first metal layer BSM may be formed on the first buffer layer BUF1, and a second buffer layer BUF2 may be formed on the first buffer layer BUF1 to surround the first metal layer BSM. Each of the first and second buffer layers BUF1 and BUF2 may be formed of an inorganic insulating material, and may include one or more insulating layers.

In some cases, the first metal layer BSM may be formed under the first buffer layer BUF1. In this case, the first and second buffer layers BUF1 and BUF2 may be formed on the first metal layer BSM.

The first metal layer BSM may be patterned in a photolithography process. The first metal layer BSM may include a light shield pattern. The light shield pattern may block external light so that light is not irradiated to an active layer of the TFT, thereby preventing a photo current of the TFT formed in the pixel area. If the light shield pattern is formed of a metal having a lower absorption coefficient of a laser wavelength used in a laser ablation process compared to a metal layer (e.g., a cathode) to be removed from a sensing area SA, the light shield pattern may serve as a shielding layer for blocking a laser beam LB in the laser ablation process.

The active layer ACT may be formed of a semiconductor material on the second buffer layer BUF2 and patterned by a photolithography process. The active layer ACT may include an active pattern of each of the TFTs of the pixel circuit and the TFTs of the gate driver. A portion of the active layer ACT may be metallized by ion doping. The metallized portion may be used as a jumper pattern connecting metal layers at some nodes of the pixel circuit to connect components of the pixel circuit.

A gate insulating layer GI may be formed on the second buffer layer BUF2 to cover the active layer ACT. The gate insulating layer GI may be formed of an inorganic insulating material.

A second metal layer GATE may be formed on the gate insulating layer GI. The second metal layer GATE may be patterned by a photolithography process. The second metal layer GATE may be used as a gate line, a gate electrode, a lower electrode of a storage capacitor, and a jumper pattern connecting patterns of the first metal layer BSM and a third metal layer TM.

A first interlayer insulating layer ILD1 may be formed on the gate insulating layer GI to cover the second metal layer GATE. The third metal layer TM may be formed on the first interlayer insulating layer ILD1, and a second interlayer insulating layer ILD2 may cover the third metal layer TM. The third metal layer TM may be patterned by a photolithography process. The third metal layer TM may include metal patterns such as the upper electrode of the storage capacitor. The first and second interlayer insulating layers ILD1 and ILD2 may include an inorganic insulating material.

A fourth metal layer SD1 may be formed on the second interlayer insulating layer ILD2, and an inorganic insulating layer PAS1 and a first planarization layer PLN1 may be stacked thereon. A fifth metal layer SD2 may be formed on the first planarization layer PLN1. The first and second planarization layers PLN1 and PLN2 may be formed of an organic insulating material for flattening surfaces.

The fourth metal layer SD1 may be connected to the first and second electrodes of the TFT connected to the active pattern of the TFT through a contact hole penetrating the second interlayer insulating layer ILD2. The data lines and power lines may be implemented with the fourth metal layer SD1 or the fifth metal layer SD2.

An anode electrode AND (which may be, hereinafter, referred to as an anode), which is a first electrode layer of a luminous element OLED, may be formed on the second planarization layer PLN2. The anode AND may be connected to an electrode of the driving TFT through a contact hole passing through the second planarization layer PLN2. The anode AND may be formed of a transparent or translucent electrode material.

A pixel defining layer (or bank) BNK may cover the anode AND of the luminous element OLED. The pixel defining layer BNK may be formed in a pattern defining a light emitting area (or an opening area) through which light passes from each of the pixels to the outside. A spacer SPC may be formed on the pixel defining layer BNK.

In some cases, the pixel defining layer BNK and the spacer SPC may be integrated with the same organic insulating material. The spacer SPC may secure a gap between a fine metal mask (FMM) and the anode AND so that the FMM is not in contact with the anode AND in the deposition process of a light emitting layer EL (or organic compound).

The light emitting layer EL may be formed in each of the light emitting area of the pixels defined by the pixel defining layer BNK. A cathode CAT, which is a second electrode layer of the luminous element OLED, may be formed on the entire surface of the display device 100 to cover the pixel defining layer BNK, the spacer SPC, and the light emitting layer EL. The cathode CAT may be connected to a low potential driving voltage (e.g., EVSS) line formed of any one of the metal layers thereunder.

Although not shown, a capping layer CPL may be disposed on the cathode CAT. The capping layer CPL may cover the cathode CAT. The capping layer CPL may be formed of an inorganic insulating material to block penetration of air and outgassing of an organic insulating material applied on the capping layer CPL to protect the cathode CAT. An encapsulation layer may be disposed on the capping layer CPL. According to an example embodiment, the capping layer CPL may be included in the encapsulation layer.

The encapsulation layer may include inorganic insulating layers PAS2 and PAS3, and a foreign material compensation layer PCL therebetween. For example, a lower inorganic insulating layer PAS2 may cover the capping layer CPL, and the foreign material compensation layer PCL may be formed on the lower inorganic insulating layer PAS2. The foreign material compensation layer PCL may include an organic insulating material. An upper inorganic insulating layer PAS3 may be formed on the foreign material compensation layer PCL.

A touch configuration may be disposed on the upper inorganic insulating layer. For example, a touch buffer ToE-BUF and a touch insulating layer ToE-ILD may be disposed on the upper inorganic insulating layer. A touch bridge ToE-B and a touch sensor ToE-S may be disposed in a hole formed in at least a portion of the touch insulating layer. At least a portion of the touch sensor ToE-S may be disposed on the touch bridge ToE-B, and at least another portion of the touch sensor ToE-S may be disposed on the touch insulating layer ToE-ILD. A photoacrylic PAC may be disposed on the touch insulating layer ToE-ILD and the touch sensor ToE-S. The photoacrylic PAC may be an organic insulating layer.

Referring to FIG. 8, the cathode CAT is disposed in the pixel area PIX but may be omitted from the light transmittance portion AG between the pixel areas PIX. Accordingly, there may be formed an opening in which the cathode CAT is omitted. That is, the cathode CAT may be formed up to the boundary of the opening. In this case, the opening may be formed as an area corresponding to the light transmittance portion AG. The opening may be formed by forming the cathode CAT on the pixel defining layer BNK and then etching the cathode CAT and the pixel defining layer BNK at once. However, the present disclosure is not limited thereto, and may be formed in various ways.

A sensor 800 (or an optical sensor) may be disposed under the third area A3. Specifically, the sensor 800 may be disposed in at least a portion of an area corresponding to the third area A3 of the display panel. The sensor 800 may include an optical sensor, but is not limited thereto, and may include at least one of various types of sensors, such as an infrared sensor and an ultraviolet sensor.

A display device according to an example embodiment of the present disclosure may include a panel including a first area corresponding to a first resolution, a second area corresponding to a second resolution lower than the first resolution, and a third area corresponding to a third resolution lower than the second resolution, and a sensor disposed under the panel to overlap at least a portion of the third area. In this case, a plurality of pixels may be disposed in the first area based on a first arrangement corresponding to a first pixel group including a plurality of sub-pixels, a plurality of pixels may be disposed in the second area based on a second arrangement corresponding to a second pixel group in which at least one of the plurality of sub-pixels of the first pixel group is omitted, a plurality of pixels may be disposed in at least a part of the third area based on the first arrangement, and a light transmittance portion may be disposed in another part of the third area.

In an embodiment, the plurality of sub-pixels of the first pixel group may include one red sub-pixel, two green sub-pixels, and one blue sub-pixel.

In an embodiment, a shape of each of the red sub-pixel and the blue sub-pixel may correspond to a rectangle, and a shape of each of the two green sub-pixels may correspond to an ellipse or a circle.

In an embodiment, the second pixel group may be a pixel group in which one green sub-pixel among the plurality of sub-pixels of the first pixel group is omitted.

In an embodiment, the red sub-pixel and the blue sub-pixel may be arranged in a first row along an x-axis direction, and the two green sub-pixels may be arranged in a second row separated from the first row along the x-axis direction.

In an embodiment, one of the two green sub-pixels may be arranged in a first diagonal direction with an inclination of 45° with respect to an x-axis direction, and the other one of the two green sub-pixels may be arranged in a second diagonal direction with an inclination of −45° with respect to the x-axis direction.

In an embodiment, the two green sub-pixels may be arranged to be symmetrical with respect to a y-axis direction.

In an embodiment, the second pixel group may be a pixel group in which the one of the two green sub-pixels arranged in the first diagonal direction is omitted from among the plurality of sub-pixels of the first pixel group.

In an embodiment, the second pixel group may be a pixel group in which the other one of the two green sub-pixels arranged in the second diagonal direction is omitted from among the plurality of sub-pixels of the first pixel group.

In an embodiment, the second area may be disposed between the first area and the third area.

In an embodiment, the third area may include a first pixel and a second pixel corresponding to the first arrangement, and the light transmittance portion may be disposed between the first pixel and the second pixel.

In an embodiment, the sensor may include at least one of an optical sensor, a camera sensor, an infrared sensor and an ultraviolet sensor.

In an embodiment, a plane of the light transmittance portion may correspond to a circle or a polygon.

In an embodiment, a plane of the third area may correspond to a circle or a polygon.

In an embodiment, the second area may surround a perimeter of the third area while being adjacent to the third area, and the first area may surround a perimeter of the second area while being adjacent to the second area.

In an embodiment, a distance between the first area and the third area may correspond to a length of a unit pixel.

A display panel according to an embodiment of the present disclosure may include a first area corresponding to a first resolution, a second area corresponding to a second resolution lower than the first resolution, and a third area corresponding to a third resolution lower than the second resolution. In this case, a plurality of pixels may be disposed in the first area based on a first arrangement corresponding to a first pixel group including a plurality of sub-pixels, a plurality of pixels may be disposed in the second area based on a second arrangement corresponding to a second pixel group in which at least one of the plurality of sub-pixels of the first pixel group is omitted, a plurality of pixels may be disposed in at least a part of the third area based on the first arrangement, and a light transmittance portion may be disposed in another part of the third area.

In an embodiment, the plurality of sub-pixels of the first pixel group may include one red sub-pixel, two green sub-pixels, and one blue sub-pixel.

In an embodiment, a shape of each of the red sub-pixel and the blue sub-pixel may correspond to a rectangle, and a shape of each of the two green sub-pixels may correspond to an ellipse or a circle.

In an embodiment, the second pixel group may be a pixel group in which one green sub-pixel among the plurality of sub-pixels of the first pixel group is omitted.

Although the embodiments of the present disclosure have been described in more detail with reference to the accompanying drawings, the present invention is not necessarily limited to these embodiments, and various modifications may be within the scope of the present invention. Accordingly, the embodiments disclosed in the present disclosure are not intended to limit the scope of the present invention, but to exemplarily explain the present invention, and the scope of the present invention is not limited by these embodiments. Therefore, there should be understood that the embodiments described above are illustrative in all respects and not restrictive. The protection scope of the present invention should be construed by the following claims, and all technical features within the scope equivalent thereto should be construed as being included in the scope of the present invention.

What is claimed is:

1. A display apparatus, comprising:
a panel including a first area corresponding to a first resolution, a second area corresponding to a second resolution lower than the first resolution, and a third area corresponding to a third resolution lower than the second resolution; and
a sensor disposed under the panel to overlap at least a portion of the third area,
wherein:
a plurality of pixels are disposed in the first area based on a first arrangement corresponding to a first pixel group including a plurality of sub-pixels;
a plurality of pixels are disposed in the second area based on a second arrangement corresponding to a second pixel group which is different from the first pixel group by omitting at least one sub-pixel from among the plurality of sub-pixels of the first pixel group;
a plurality of pixels are disposed in at least a part of the third area, based on the first arrangement;
a light transmittance portion is disposed in another part of the third area;
in the second area, a touch insulating layer overlapping at least one pixel among the plurality of pixels and a touch sensor overlapping at least a portion of the touch insulating layer are disposed; and
in the third area, the touch insulating layer extending from the second area is disposed.

2. The display apparatus of claim 1, wherein the plurality of sub-pixels of the first pixel group comprises one red sub-pixel, two green sub-pixels, and one blue sub-pixel.

3. The display apparatus of claim 2, wherein a shape of each of the red sub-pixel and the blue sub-pixel corresponds to a rectangle, and a shape of each of the two green sub-pixels corresponds to an ellipse or a circle.

4. The display apparatus of claim 2, wherein the second pixel group is a pixel group which is different from the first pixel group by omitting one green sub-pixel from among the plurality of sub-pixels of the first pixel group.

5. The display apparatus of claim 2, wherein the red sub-pixel and the blue sub-pixel are arranged in a first row along an x-axis direction, and the two green sub-pixels are arranged in a second row separated from the first row along the x-axis direction.

6. The display apparatus of claim 2, wherein the two green sub-pixels are arranged to be symmetrical with respect to a y-axis direction.

7. The display apparatus of claim 2, wherein one of the two green sub-pixels is arranged in a first diagonal direction with an inclination of 45° with respect to an x-axis direction, and the other one of the two green sub-pixels is arranged in a second diagonal direction with an inclination of −45° with respect to the x-axis direction.

8. The display apparatus of claim 7, wherein the second pixel group is a pixel group which is different from the first pixel group by omitting the one of the two green sub-pixels arranged in the first diagonal direction from among the plurality of sub-pixels of the first pixel group.

9. The display apparatus of claim 7, wherein the second pixel group is a pixel group which is different from the first pixel group by omitting the other one of the two green sub-pixels arranged in the second diagonal direction is omitted from among the plurality of sub-pixels of the first pixel group.

10. The display apparatus of claim 1, wherein the second area is disposed between the first area and the third area.

11. The display apparatus of claim 1, wherein the third area comprises a first pixel and a second pixel corresponding to the first arrangement, and the light transmittance portion is disposed between the first pixel and the second pixel.

12. The display apparatus of claim 1, wherein the sensor comprises at least one of an optical sensor, a camera sensor, an infrared sensor, and an ultraviolet sensor.

13. The display apparatus of claim 1, wherein a plane of the light transmittance portion corresponds to a circle or a polygon.

14. The display apparatus of claim 1, wherein a plane of the third area corresponds to a circle or a polygon.

15. The display apparatus of claim 1, wherein the second area surrounds a perimeter of the third area while being adjacent to the third area, and the first area surrounds a perimeter of the second area while being adjacent to the second area.

16. The display apparatus of claim 1, wherein a distance between the first area and the third area corresponds to a length of a unit pixel.

17. A display panel, comprising:
a first area corresponding to a first resolution;
a second area corresponding to a second resolution lower than the first resolution; and
a third area corresponding to a third resolution lower than the second resolution,
wherein:
a plurality of pixels are disposed in the first area based on a first arrangement corresponding to a first pixel group including a plurality of sub-pixels;
a plurality of pixels are disposed in the second area based on a second arrangement corresponding to a second pixel group which is different from the first pixel group by omitting at least one sub-pixel from among the plurality of sub-pixels of the first pixel group;
a plurality of pixels are disposed in at least a part of the third area, based on the first arrangement;
a light transmittance portion is disposed in another part of the third area;
in the second area, a touch insulating layer overlapping at least one pixel among the plurality of pixels and a touch sensor overlapping at least a portion of the touch insulating layer are disposed; and
in the third area, the touch insulating layer extending from the second area is disposed.

18. The display panel of claim 17, wherein the plurality of sub-pixels of the first pixel group comprises one red sub-pixel, two green sub-pixels, and one blue sub-pixel.

19. The display panel of claim 18, wherein a shape of each of the red sub-pixel and the blue sub-pixel corresponds to a rectangle, and a shape of each of the two green sub-pixels corresponds to an ellipse or a circle.

20. The display panel of claim 18, wherein the second pixel group is a pixel group which is different from the first pixel group by omitting one green sub-pixel from among the plurality of sub-pixels of the first pixel group.

\* \* \* \* \*